United States Patent
Masse et al.

(10) Patent No.: US 10,653,031 B2
(45) Date of Patent: May 12, 2020

(54) SMART MODULE FOR PATCH ENCLOSURE PANEL RECEIVING DATA TRANSFER CABLES

(71) Applicant: SCHNEIDER ELECTRIC INDUSTRIES SAS, Rueil Malmaison (FR)

(72) Inventors: Dominique Masse, Epinay sur Orge (FR); Younes Issiakhem, Miserey (FR); Cédric Chauvin, Paris (FR); Deepak Vinjamoor Murali, Rueil Malmaison (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 16/377,333

(22) Filed: Apr. 8, 2019

(65) Prior Publication Data

US 2019/0327850 A1    Oct. 24, 2019

(30) Foreign Application Priority Data

Apr. 23, 2018 (FR) ...................... 18 53545

(51) Int. Cl.
*H05K 7/00* (2006.01)
*H05K 7/14* (2006.01)
*H01R 12/77* (2011.01)
*H01R 13/66* (2006.01)
*H01R 25/00* (2006.01)

(52) U.S. Cl.
CPC ........... *H05K 7/1491* (2013.01); *H01R 12/77* (2013.01); *H01R 13/6641* (2013.01); *H01R 13/6683* (2013.01); *H01R 25/006* (2013.01); *H05K 7/1489* (2013.01)

(58) Field of Classification Search
USPC ......................................... 361/747
See application file for complete search history.

(56) References Cited

U.S. PATENT DOCUMENTS

| | | | | |
|---|---|---|---|---|
| 6,535,367 B1 * | 3/2003 | Carpenter | .............. | H01R 29/00 361/115 |
| 6,818,834 B1 * | 11/2004 | Lin | ......................... | H02G 3/32 174/135 |
| 7,343,078 B2 * | 3/2008 | Spisany | ............... | H01R 9/2408 385/101 |
| 7,488,205 B2 * | 2/2009 | Spisany | ................... | H04Q 1/13 385/135 |
| 7,510,421 B2 * | 3/2009 | Fransen | ............... | H01R 9/2416 439/449 |

(Continued)

OTHER PUBLICATIONS

Notification dated Jan. 30, 2019 with a Written Opinion and Search Report for French Patent Application No. FR1853545, 7 pages.

*Primary Examiner* — Hung S. Bui
(74) *Attorney, Agent, or Firm* — Locke Lord LLP

(57) ABSTRACT

A smart module (1) intended to equip a passive panel (12) of a patch enclosure comprising two lateral uprights (16, 17) bearing a series of passive panels. The module (1) comprises a body (2) in the form of a ruler and two fixing tabs (3, 4), each fixing tab (3, 4) comprising at least one hole (21-24) allowing it to be fixed rigidly to an upright (16, 17) by means of a screw, each fixing tab (3, 4) being able to be rigidly secured to an end of the body (2) by snap-fitting.

7 Claims, 5 Drawing Sheets

(56) References Cited

U.S. PATENT DOCUMENTS

| | | | | |
|---|---|---|---|---|
| 8,075,344 B2* | 12/2011 | Shih | ................ | H01R 13/518 |
| | | | | 439/649 |
| 8,093,499 B2* | 1/2012 | Hoffer | ............... | H02G 3/0456 |
| | | | | 174/68.1 |
| 2003/0073343 A1 | 4/2003 | Belesimo | | |
| 2006/0291144 A1* | 12/2006 | Verding | ............... | H04Q 1/13 |
| | | | | 361/600 |
| 2008/0122579 A1* | 5/2008 | German | ............ | H01R 13/6683 |
| | | | | 340/10.1 |
| 2011/0229102 A1 | 9/2011 | Wagner et al. | | |
| 2013/0234725 A1 | 9/2013 | Enge | | |

* cited by examiner

SMART MODULE FOR PATCH ENCLOSURE PANEL RECEIVING DATA TRANSFER CABLES

TECHNICAL FIELD

The invention relates to a patch enclosure of the type used in data centres, that is to say comprising two lateral uprights bearing several panels each receiving data transfer cables, and a central manager which is linked to each panel and to an external supervision system. Such systems are typically used in data centres to ensure the multiplexing of network connections on the different ports of the panels.

STATE OF THE ART

In such a system, the front part of each panel comprises at least ports for receiving the connectors and the data transfer cables. Such is the case with the so-called passive systems, that is to say relatively old systems without additional elements such as presence sensors or diodes.

In such more recent, called smart systems, each panel comprises, in addition to its connection ports, an additional electronic component communicating with the central manager, and comprising, for each port, a presence sensor and a diode.

Each presence sensor detects the occupied or free state of the port with which it is associated, depending on whether a connector is or is not present in this port, and this information is transmitted to the central manager.

Each diode is illuminated with a given colour corresponding to the application of the port with which it is associated, the colour information being transmitted by the central manager. The correlations are for example blue for an internet connection, red for a television data stream, yellow for a video stream and ivory for telephone calls.

To implement a smart-type system, it is possible to install commercially available current smart patch enclosures, which can induce a significant cost.

Another possibility consists in adding an add-on module equipped with sensors and diodes to each passive panel of existing enclosures, and a central manager to each enclosure. This other possibility can be envisaged when the panels of the existing passive system were designed to receive an add-on module. However, this is not a possibility for the so-called standard passive panels, that is to say those which have not initially been designed to receive a specific add-on module.

The aim of the invention is to provide a solution that makes it possible to add a smart add-on component to a standard panel, in order to transform it into a smart panel at lower cost.

SUMMARY OF THE INVENTION

To this end, the subject of the invention is a smart module intended to equip a passive panel formed by two lateral uprights of a patch enclosure, the passive panel comprising a front face provided with connection ports, this module comprising a body in the form of a ruler and two fixing tabs, the body comprising a series of diodes and a series of presence sensors, each fixing tab comprising at least one hole allowing it to be fixed rigidly to an upright by means of a screw, each end of the body being able to be rigidly secured to a fixing tab by being gripped and/or snap-fitted by this tab.

With this arrangement, the smart module body can be mounted on any standard panel because it is only held by its ends directly fixed to the lateral uprights of the enclosure. It can thus be suitably positioned such that its diodes and sensors are in line with the ports of the standard panel, to be directly above them while leaving them clear to allow the connection and the disconnection of data transfer cables.

The invention relates also to a module thus defined, wherein each tab comprises a base extended on one side by two wings forming a clamp to grip an end of the body and on the other side by a tongue extending in the opposite direction to the wings relative to the base by being at right angles to the wings and to the base, this tongue comprising at least one fixing hole.

The invention relates also to a module thus defined, wherein at least one wing comprises at least one snap-fitting window, and wherein a face of the body is provided with a snug that engages in this window to ensure a snap-fitting of the tab onto the end of the body.

The invention relates also to a module thus defined, wherein the body comprises, on one of its faces, a connector intended to receive a data transfer and electrical power supply cable.

The invention relates also to a module thus defined, wherein the connector is intended to receive a flat cable of ribbon cable of electrical conductors type.

The invention relates also to a module thus defined, comprising a body associated with several pairs of fixing tabs of different forms to allow it to be mounted according to different configurations.

The invention relates also to a smart system for a patch enclosure comprising several modules thus defined and a central manager intended to be connected to each module.

DETAILED DESCRIPTION OF PARTICULAR EMBODIMENTS

The idea on which the invention is based is to design a module that can be mounted on all the standard passive panels whether or not they were designed to be equipped with a smart module.

Figure 1:
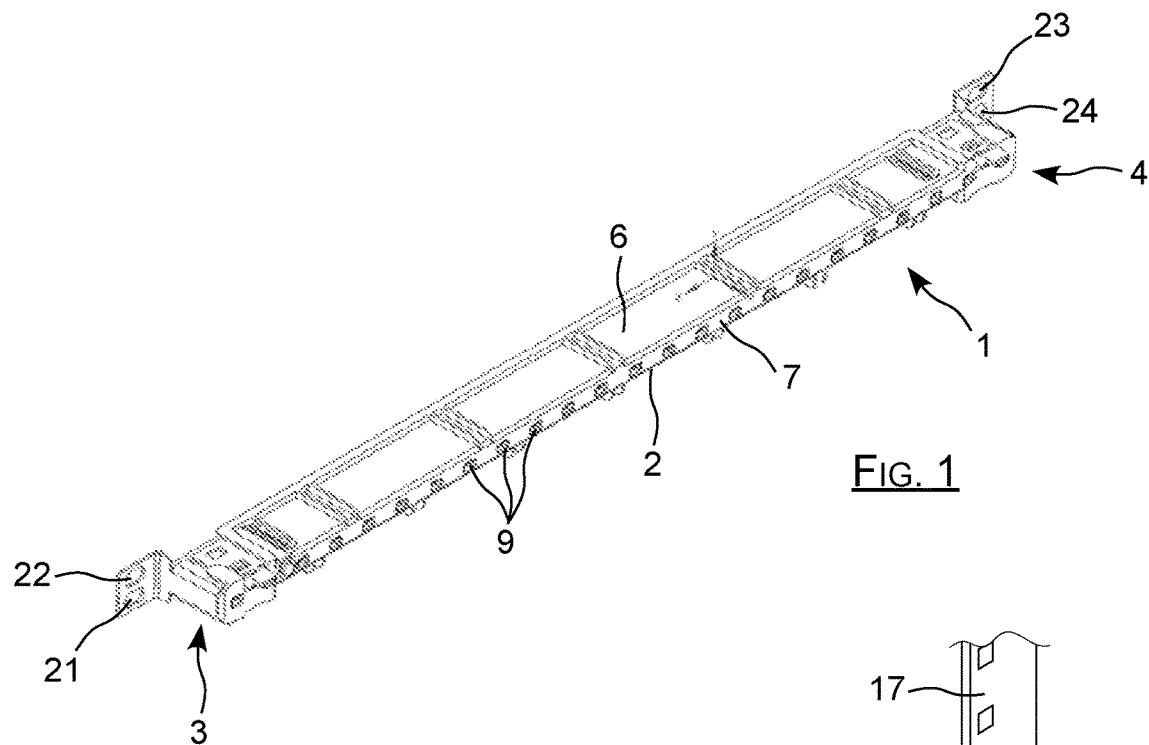
FIG. 1 is a perspective view of the smart module according to the invention.

The module according to the invention which is represented in FIG. 1 where it is identified as 1 comprises a main body 2 of generally parallelepipedal form, which is equipped at each of its ends with a fixing tab, these tabs being identified as 3 and 4.

This body 2 in the form of a ruler comprises a top face 6 and a front face 7, visible in the figures, and a bottom face opposite the top face 6 and a rear face opposite the front face 7. These four main faces are joined by two lateral faces, one of which, identified as 8, is visible in FIG. 4.

The body 2 which here conforms to the so-called nineteen-inch standard comprises a series of twenty four diodes identified as 9 which are flush with its front face 7, being evenly spaced apart along the latter, and it incorporates a series of twenty four presence sensors that are not visible which are oriented towards its bottom face.

Figure 2:
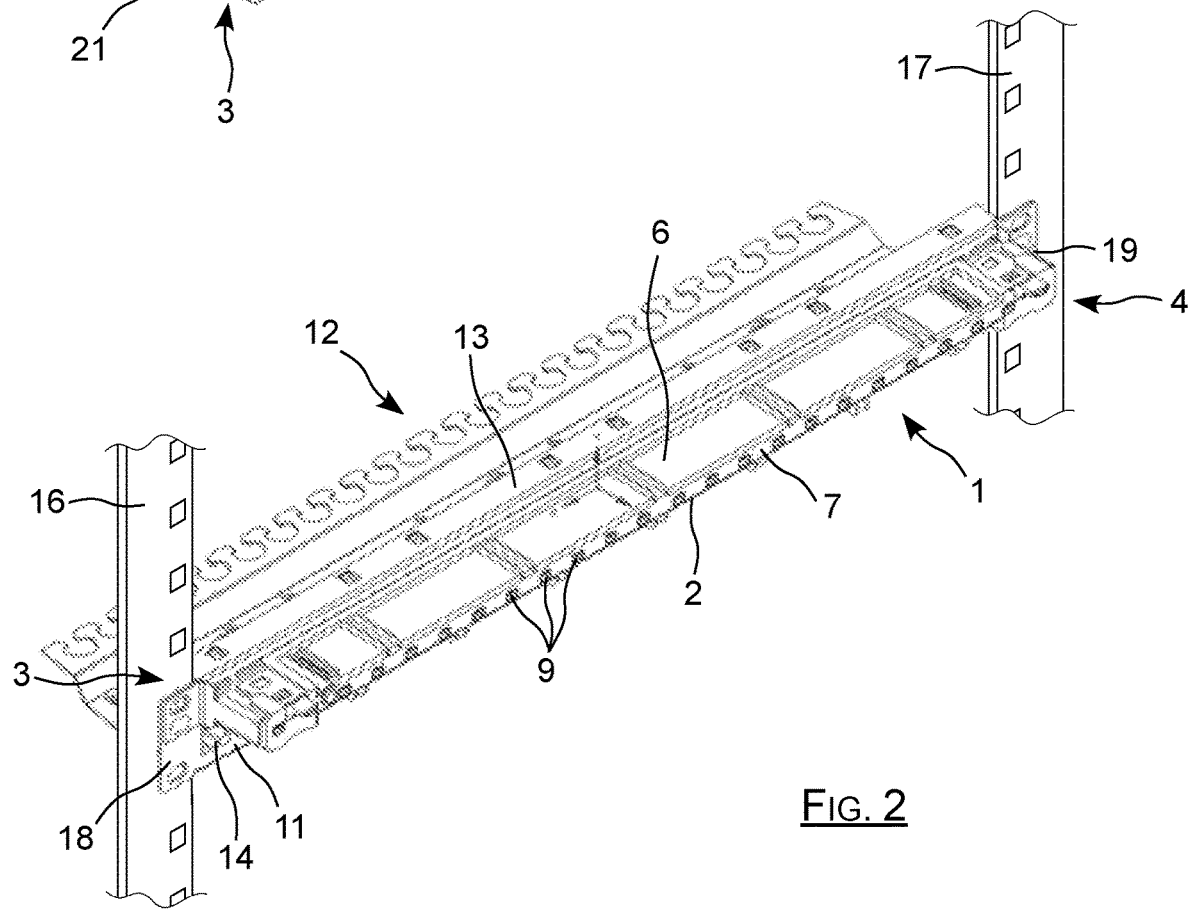
FIG. 2 is a perspective view of a passive panel equipped with the smart module according to the invention.

As represented in FIG. 2, this module 1 is designed to be attached to the top part of a front face 11 of a standard passive panel 12 so as to complement it.

When the module is in place, as in FIG. 2, its rear face runs along a top region of the front face 11 of the standard module, this front face 11 having a top edge 13 extending in the extension of the top face 6 of the body 2.

The thickness of the body 2, that is to say the distance separating its top face from its bottom face, is less than half the height of the front face 11 of the panel 12, namely the distance separating the top edge 13 of this panel from its opposite edge.

The panel 12 is, for its part, provided with twenty-four connection ports 14, one of which is visible in FIG. 2, these ports 14 emerging in the bottom half of the front face 11, being evenly spaced apart from one another along the latter.

Thus, when the module 1 is in place as illustrated in FIG. 2, it extends beyond the front face 11, and its diodes 9 and its sensors are situated above the ports 14 and facing the latter, these ports 14 being clear and accessible to receive data transfer cables that are not represented.

The sensors situated in line with the ports are for example infrared sensors or sensors operating in visible light, or any other solution making it possible to detect the physical presence of a connector plugged into the port.

In service, each diode 9 is lit with a colour corresponding to the application of the port above which it is located, and each port is topped by a sensor capable of detecting whether it is occupied or free, that is to say whether or not a connector is plugged into this port.

The panel 12 is fixed to two lateral uprights 16 and 17 of an enclosure by lugs 18 and 19 each extending from its ends. Here, each lug comprises two holes through which fixing screws for fixing to the corresponding upright are passed, that are not represented.

The mounting of the module 1 according to the invention consists firstly in fixing its two tabs 3 and 4 to the uprights 16 and 17 above the lugs 18 and 19, these tabs themselves comprising fixing holes identified as 21 to 24, then in snap-fitting each of the two ends of the body 2 into the corresponding tab.

Figure 3:
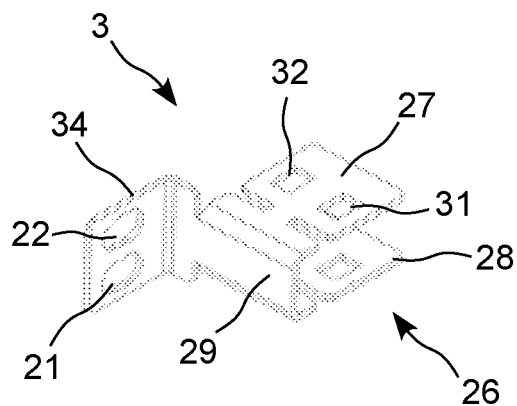
FIG. 3 is a perspective view of a fixing tab for fixing an end of the smart module according to the invention to an enclosure.

As can be seen in FIG. 3, the fixing tab 3 more particularly comprises a clamp 26 forming its main portion, having two parallel planar wings 27 and 28 which are spaced apart from one another by a distance corresponding to the thickness of the body 2. These two rectangular planar wings 27 and 28 are joined and borne by a planar and rectangular base 29 that they extend, to form, together with this base, a clamp having, in section, a form corresponding to the letter U, arranged to grip an end of the body 2 and be snap-fitted therewith.

Figure 4:
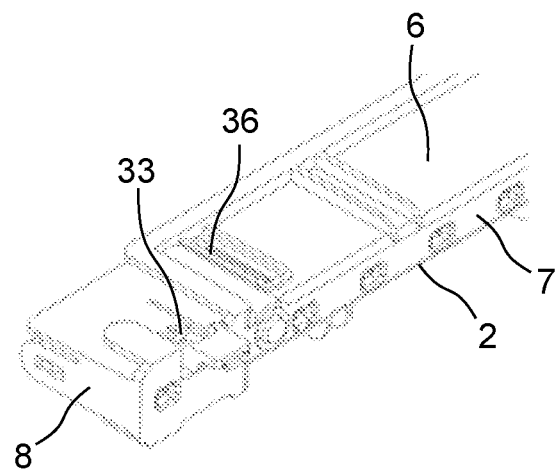
FIG. 4 is a perspective view of an end of a smart module according to the invention before snap-fitting into its fixing tab.

The parallel wings 27 and 28 extend at right angles to the base 29, extending two opposite edges thereof. As can be seen in FIG. 3, the wing 27 comprises two openings or snap-fitting windows 31 and 32 intended for snap-fitting by engagement of a snug 33 in one of these windows. This snug 33 extends beyond the top face 6 by being situated in an end region of the body 2, as can be seen in FIG. 4.

In addition, one of the two remaining edges of the rectangular base 29 is extended by a planar fixing tab 34 extending in the opposite direction to the wings 27 and 28 relative to the base 29. This tongue 34 is oriented at right angles to the wings and to the base and is equipped with fixing holes 21 and 22.

The fixing of the tab 3 to the upright 16 consists in removing the top fixing screw from the lug 18 extending the front face 11. The tab 3 is then positioned for the clamp 26 to extend beyond the upright 16, by pressing the tongue 34 onto the lug 18 and by positioning its hole 22 in line with the corresponding hole of this lug 18, the wings 27 extending horizontally by being oriented towards the other upright 17. The screw which has been removed can then be fitted through the holes of the tab, of the lug, and of the upright 16 to be screwed and tightened. The tab 4 is fixed likewise to the other upright 17.

When the tabs 3 and 4 are mounted, the body 2 of the module can be installed, which consists in offering it facing and at a distance from the front face 11 with its ends facing the tabs 3 and 4. A pressure on the body 2 towards the face 11 makes it possible to engage its ends in the tabs 3 and 4 for these tabs to grip these ends, and to push it until it is snap-fitted.

Figure 5:
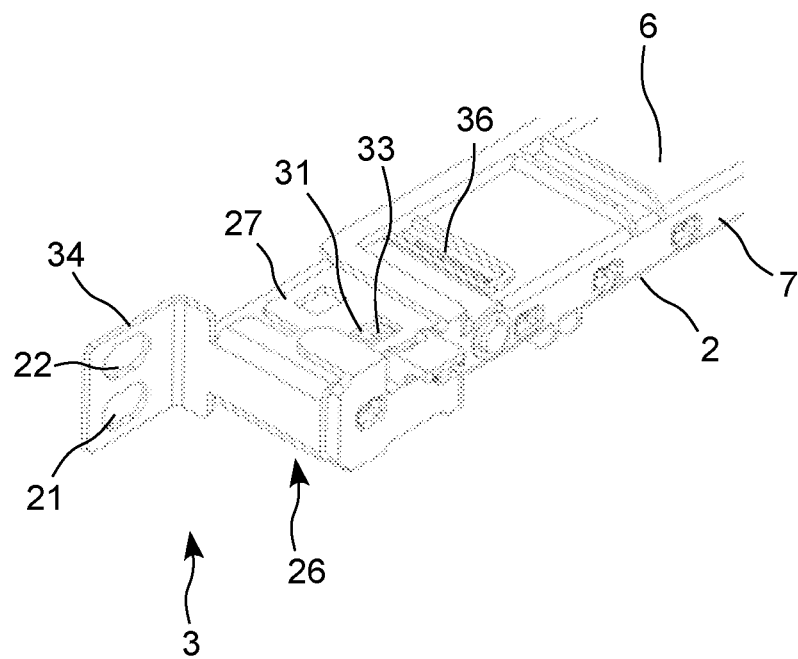
FIG. 5 is a perspective view of an end of a smart module according to the invention snap-fitted into its fixing tab.

As represented in FIG. 5, the snap-fitting of the end into the tab 3 is obtained when the snug 33 is engaged in the window 31. The same goes for the snap fitting of the other end into the tab 4.

The connection of the body 2 is ensured by means of an electrical ribbon cable ensuring its electrical power supply and the transfers of data via the central manager to which it is connected.

To this end, and as can be seen in particular in FIG. 5, the top face 6 of the body 2 is equipped with a female connector 36 in the form of a bar extending over most of the width of this top face 6 by being oriented at right angles to the main edges of this top face 6.

Figure 6:
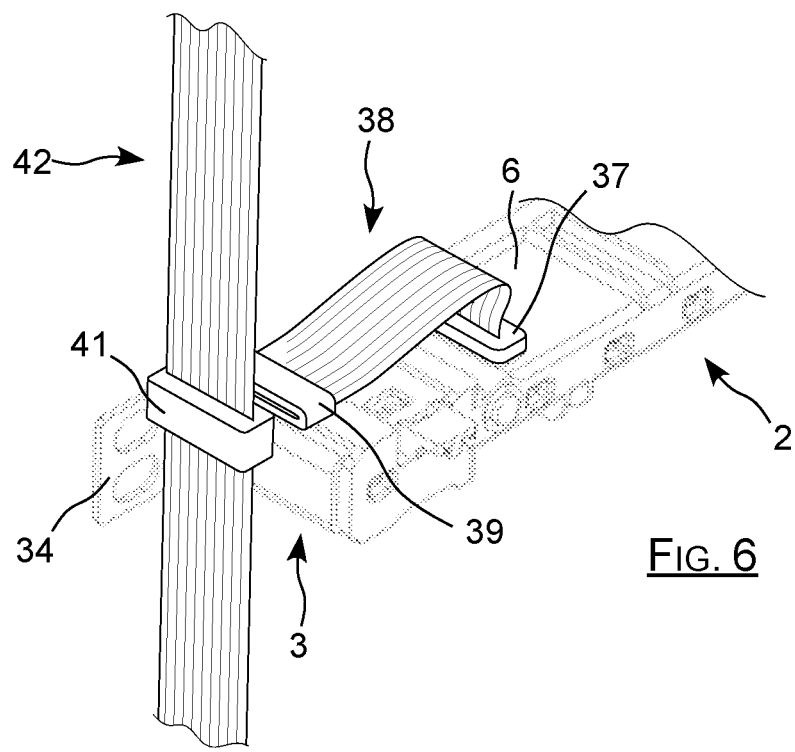
FIG. 6 is a perspective view of an end of a smart module according to the invention represented alone, showing its connection to a central manager.
Figure 7:
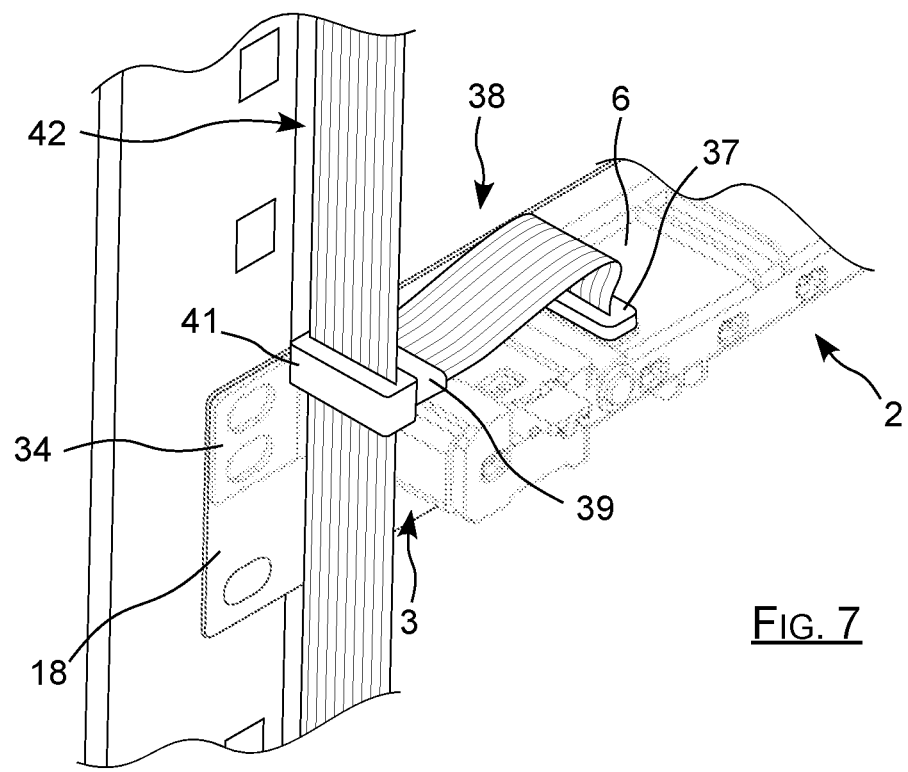
FIG. 7 is a perspective view of an end of a module according to the invention represented installed on an enclosure and showing its connection to a central manager.

As illustrated in FIGS. 6 and 7, this female connector 36 is arranged to receive a corresponding male connector 37 terminating an end of a connection jumper 38, this jumper having, at its other end, another connecter 39. This jumper 38 is formed from a ribbon cable of electrical conductors so as to be able to be folded along the top face 6 towards the end of the body 2 to be able to be connected by its other connector 39 to a corresponding connecter 41 of a main ribbon cable 42 which runs along the upright 16 to be itself connected to the central manager.

The central manager which is not represented in the figures is an element in the same format as the panel 12 and as the module 1, for example in the nineteen-inch format, and it is fixed to the enclosure in the same way as the panels, by being situated for example in the top or bottom region of this enclosure.

In the example which is illustrated in FIGS. 1 to 7, the module 1 according to the invention is installed on a standard panel of flush type, that is to say whose front face 11 is positioned flush with the front faces of the uprights 16 and 17.

However, the module according to the invention can also be mounted on a panel which is mounted set back relative to the lateral uprights of the enclosure which bears it, as in the example of FIGS. 8 to 12.

Figure 8:
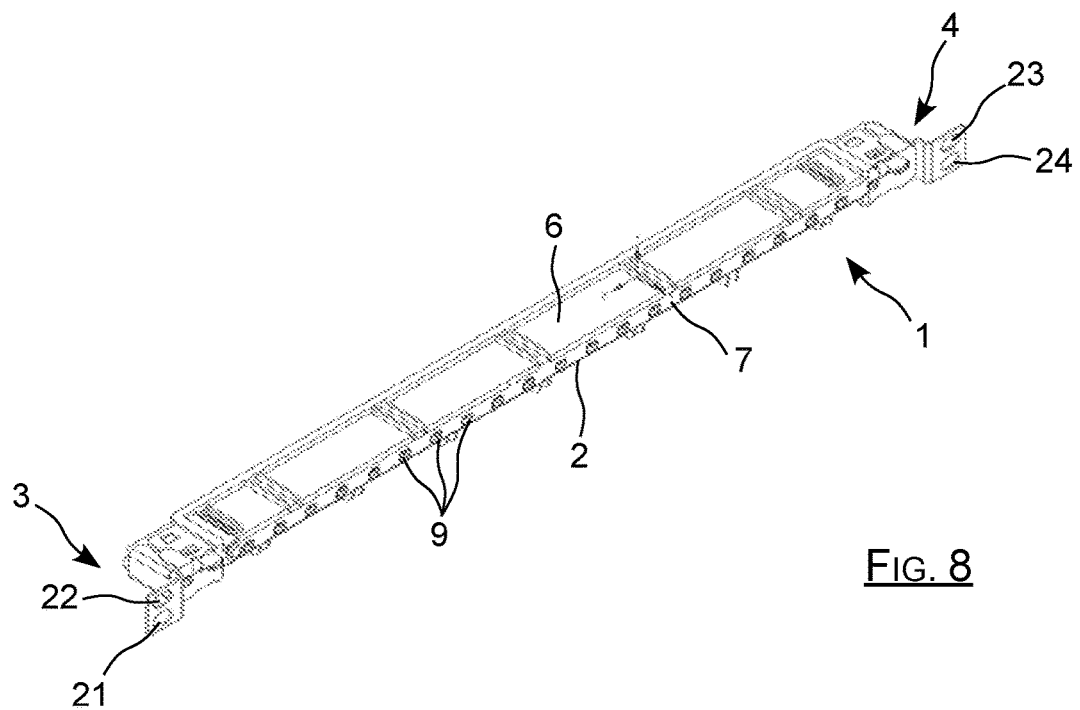
FIG. 8 is a perspective view of another mounting of the smart module according to the invention.

In this other example of mounting of the same module 1 of FIG. 8, the same tabs 3 and 4 are used by simply reversing their orientation from the front to the rear, which makes it possible to fix the body 2 against the front face 11' of another standard passive panel 12' which is mounted set back relative to the lateral uprights 16' and 17' of the enclosure which bears it.

Figure 9:
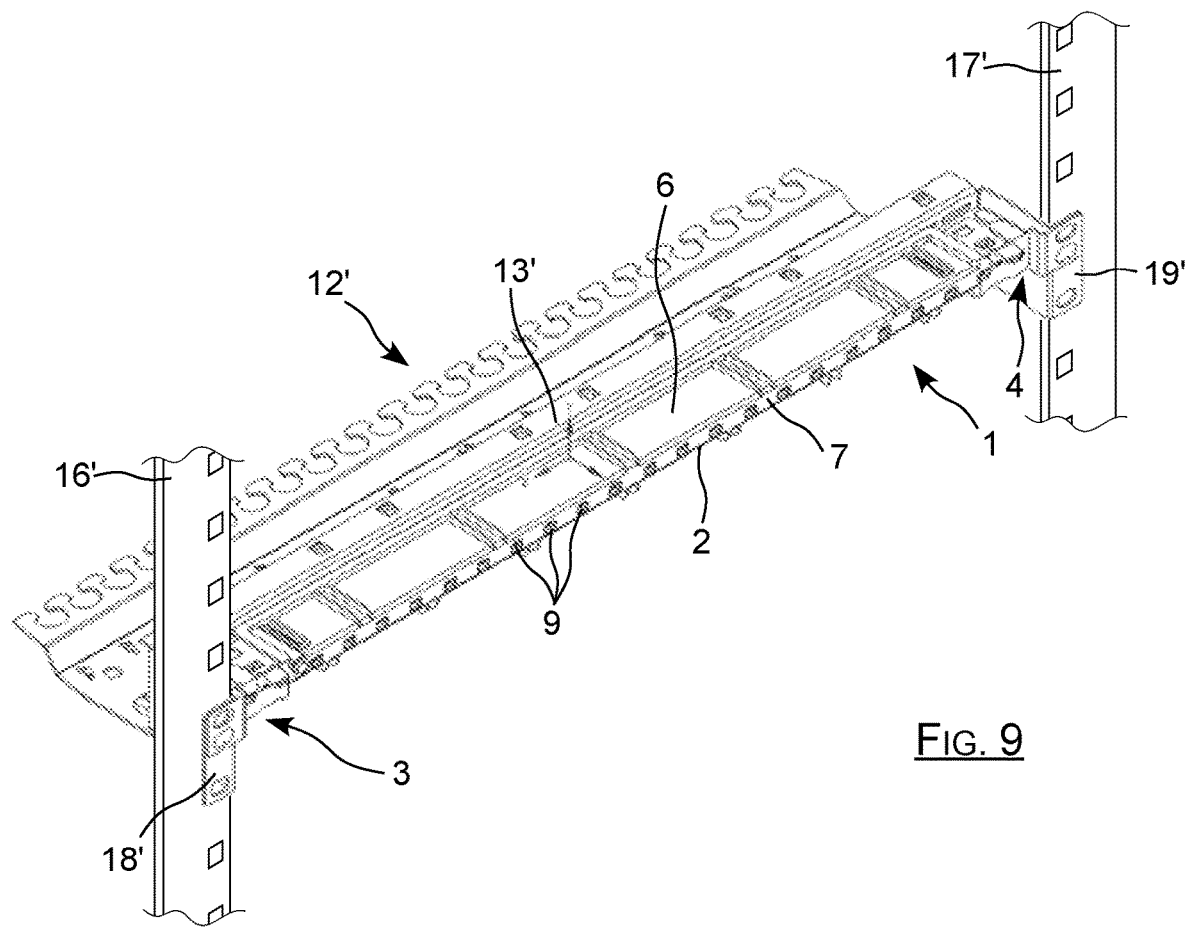
FIG. 9 is a perspective view of a passive panel equipped according to the other mounting of the smart module according to the invention.

As can be seen in FIG. 9, this panel 12' comprises a front face 11' whose ends are extended by lugs 18' and 19' which are offset relative to this front face 11' while extending parallel to the face 11' but at a distance therefrom.

This is why the panel 12' is set back relative to the uprights 16' and 17', that is to say why its front face 11' is offset towards the rear of the enclosure relative to the front faces of the uprights 16' and 17' by which it is held by virtue of the lugs 18' and 19'.

Figure 10:
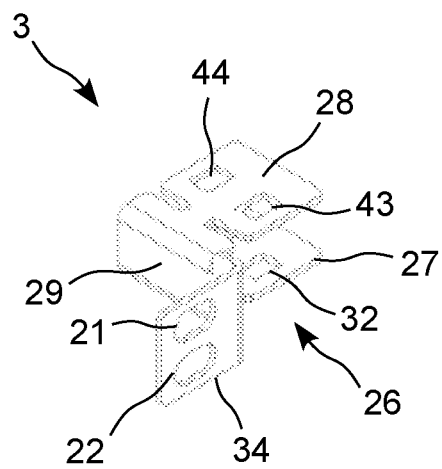
FIG. 10 is a perspective view of a fixing tab for fixing an end according to the other mounting of the smart module according to the invention to an enclosure.
Figure 11:
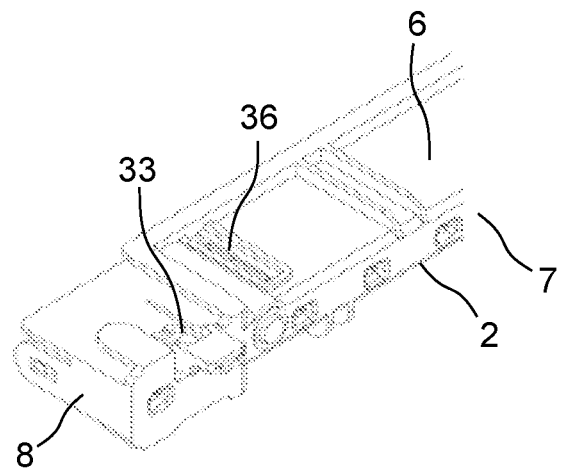
FIG. 11 is a perspective view of an end of a smart module according to the invention before snap-fitting into its fixing tab according to the other mounting.

In this other configuration, the tabs 3 and 4 are simply mounted in reverse relative to the body 2, as illustrated in FIGS. 10 and 11. There again, the fixing consists in removing the top screw from the lug 18'. The tab 3 is then positioned, but so that the clamp 26 runs along an inner lateral face of the upright 16', pressing the tongue 34 onto the lug 18' with its hole 22 in line with the corresponding hole of this lug 18', the wings 27 extending horizontally and oriented towards the other upright 17'. The removed screw can then be fitted into the holes of the tab, of the lug, and of the upright 16' to be tightened. The tab 4 is fixed likewise to the other upright 17'.

Figure 12:
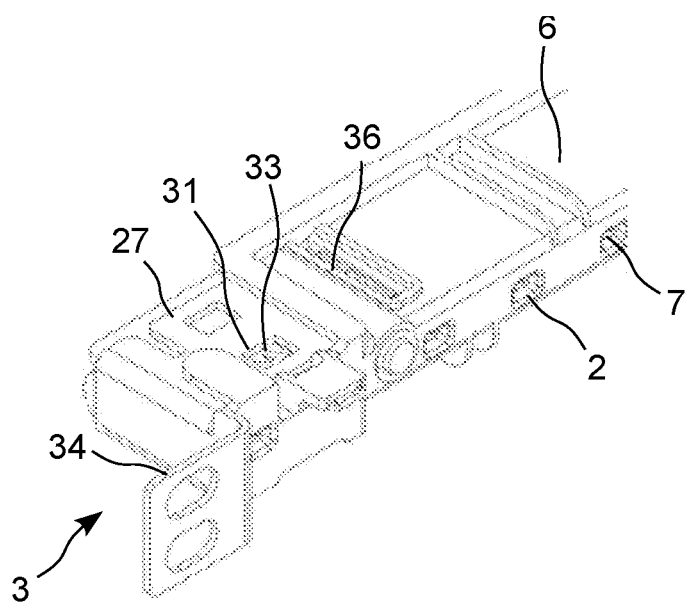
FIG. 12 is a perspective view of an end of a smart module according to the invention snap-fitted into its fixing tab according to the other mounting.

The body 2 of the module can then be installed by offering it facing and at a distance from the front face 11' with its ends facing the tabs 3 and 4, a pressure on the body 2 towards the face 11' then makes it possible to snap-fit its ends into the tabs 3 and 4, which corresponds to the situation of FIG. 12. The snap-fitting of the end of the body 2 into the tab 3 is then obtained when the snug 33 is engaged in the window 43 of the wing 28 which, also, comprises two openings or snap-fitting windows 43 and 44, just like the wing 27. The snap-fitting of the other end into the tab 4 is obtained likewise.

In the examples which have been described, the same tabs 3 and 4 are used to ensure the mounting of the body 2 according to two different configurations. To extend the adaptability of the module according to the invention, a family of different tabs having different forms matched to most of the common mountings can be provided to make the module capable of being mounted on almost any type of standard panel.

In practice, each module can be sold in the form of an assembly comprising a body 2 and several pairs of different tabs suitable for most situations.

In this other configuration, the body of the module is connected in the same way as in the first example to the central manager of the enclosure, that is to say with ribbon cables of conductors or flat cables ensuring both the electrical power supply thereof and the transfer of data.

In one case as in the other, the transfer data are information on the colour of illumination of each diode, corresponding to the application which is associated with each port or which corresponds to an action code communicated to a person facing the enclosure. This information is transmitted by the central manager to the body 2, and the signals from the sensors of the module are sent by the module to the central manager.

The invention claimed is:

1. Smart module configured as a mountable add-on for a passive patch panel borne by two lateral uprights of a patch enclosure, the passive patch panel comprising a front face provided with connection ports for receiving connectors and data transfer cables, the add-on smart module comprising a body in the form of a ruler and two fixing tabs, the body comprising a series of diodes and a series of presence sensors, each fixing tab comprising at least one hole allowing the fixing tab to be fixed rigidly to an upright of the patch enclosure by a screw, each end of the body configured to be rigidly secured to a fixing tab by being gripped and/or snap-fitted by the fixing tab.

2. Module according to claim 1, wherein each tab comprises a base extended on one side by two wings forming a clamp for gripping an end of the body and on the other side by a tongue extending in an opposite direction to the wings relative to the base by being at right angles to the wings and to the base, the tongue comprising at least one fixing hole.

3. Module according to claim 2, wherein at least one wing comprises at least one snap-fitting window, and wherein a face of the body is provided with a snug that engages in the window to ensure a snap-fitting of the tab onto the end of the body.

4. Module according to claim 3, wherein the body comprises, on one of its faces, a connector configured to receive a data transfer and electrical power supply cable.

5. Module according to claim 4, wherein the connector is configured to receive a flat cable of ribbon cable of electrical conductors type.

6. Module according to claim 1, comprising a body associated with several pairs of fixing tabs of different forms to allow the body to be mounted according to different configurations.

7. Smart system for a patch enclosure comprising several modules according to claim 1 and a central manager configured to be connected to each module.

* * * * *